United States Patent
Ivanovich et al.

(10) Patent No.: US 9,810,090 B2
(45) Date of Patent: Nov. 7, 2017

(54) METHOD FOR DETERMINING THE OSCILLATION PARAMETERS OF TURBO-MACHINE BLADES AND A DEVICE FOR PUTTING THE SAME INTO PRACTICE

(71) Applicant: Samara State Aerospace University, Samara (RU)

(72) Inventors: Danilin Aleksandr Ivanovich, Samara (RU); CHernyavskij Arkadij Zhorzhevich, Tol'yatti Samarskoj obl. (RU); Danilin Sergej Aleksandrovich, Samara (RU); Gretskov Andrej Aleksandrovich, Samara (RU)

(73) Assignee: SAMARA STATE AEROSPACE UNIVERSITY, Samara (RU)

( * ) Notice: Subject to any disclaimer, the term of this patent is extended or adjusted under 35 U.S.C. 154(b) by 308 days.

(21) Appl. No.: 14/754,563

(22) Filed: Jun. 29, 2015

(65) Prior Publication Data

US 2016/0222818 A1  Aug. 4, 2016

(30) Foreign Application Priority Data

Feb. 3, 2015 (RU) ................. 2015103552

(51) Int. Cl.
| | | |
|---|---|---|
| *H01L 21/00* | (2006.01) | |
| *H01L 29/10* | (2006.01) | |
| *F01D 21/00* | (2006.01) | |
| *H01L 51/42* | (2006.01) | |
| *H01L 27/30* | (2006.01) | |
| *F01D 17/02* | (2006.01) | |

(52) U.S. Cl.
CPC ............ *F01D 21/003* (2013.01); *F01D 17/02* (2013.01); *H01L 27/307* (2013.01); *H01L 51/428* (2013.01); *F05D 2260/80* (2013.01); *F05D 2260/83* (2013.01); *F05D 2270/334* (2013.01); *F05D 2270/44* (2013.01); *F05D 2270/803* (2013.01)

(58) Field of Classification Search
CPC ............................ H01L 27/307; H01L 51/428
USPC ........................................ 438/10–14; 257/48
See application file for complete search history.

(56) References Cited

U.S. PATENT DOCUMENTS

| 5,206,816 A * | 4/1993 | Hill ................. G01H 1/006 702/56 |
| 2012/0200087 A1* | 8/2012 | Schindele ............ F03D 7/0296 290/44 |

* cited by examiner

*Primary Examiner* — Calvin Lee
(74) *Attorney, Agent, or Firm* — Matthew A. Pequignot; Pequignot + Myers LLC

(57) ABSTRACT

Method for determining oscillation parameters of turbo-machine blades consists in that when the blade tip travels in front of a sensor, reading values of a single pulsed signal formed by the sensor are obtained in a number that is not lower than that of unknown parameters of a harmonic or polyharmonic oscillation of the blade, the origin of a single pulsed signal readings obtained for each blade being synchronized with the blade tip position relative to the sensor according to a given level of the single pulsed signal; then the values of the harmonic or polyharmonic oscillation parameters of the blade are calculated with the use of the obtained values of the single pulsed signal reading origins and of the value of the turbo-machine shaft revolution period.

4 Claims, 1 Drawing Sheet

METHOD FOR DETERMINING THE OSCILLATION PARAMETERS OF TURBO-MACHINE BLADES AND A DEVICE FOR PUTTING THE SAME INTO PRACTICE

CROSS-REFERENCE TO RELATED APPLICATIONS

The present invention claims priority from Russian Patent Application No. 2015103552 filed Feb. 3, 2015, which is incorporated herein by reference.

TECHNICAL FIELD

The present invention relates to a contactless determination of the amplitude, frequency and phase of oscillation of blades in turbo-machines and can be used to detect faults of blades during their operation and to display the fatigue strength of the blade material.

BACKGROUND OF THE INVENTION

There are known a process and a device for determining the amplitude, frequency and phase of oscillation in turbo-machine blades, based on the strain measurement of blades (Leontiev M. K. Strain measurement in aviation gas-turbine engines. Instructional manual—Moscow: MAI. 2001, pages 24-34—in Russian), consisting in the following: strain gauges are glued on the blades, the wires from the strain gauges are laid down along the blade, locking piece, wheel disc and shaft for leading them up to a particular current collector the signals of which are amplified and supplied to recording equipment.

The drawbacks of the known process and of the device for putting it into practice are as follows: a limited number of simultaneously checked blades and, as a result, an insufficient reliability of the blade oscillation parameter determination, as well as the impossibility to carry out strain measurements of blades in each turbo-machine unit.

The closest prior art for the present invention as to the technical concept is a process for determining oscillation parameters of turbo-machine blades, disclosed in the patent application GB1147737 published on Feb. 4, 1969 and consisting in the following: time intervals between the pulses of two contactless pulse detectors located in the plane of a turbo-machine wheel rotation are measured and the amplitudes of speeds and of translations of blade ends are calculated on the basis of said time intervals; then the frequency and the phase (with the precision of up to a decimal point) of the blade oscillations are determined and the maximum travels of the blade ends (deviations from the initial position) are statistically found for determining, with these results, the amplitude of the blade ends oscillations.

This known process is put into practice with a device disclosed in the patent application GB1147737 published on Feb. 4, 1969 and containing a unit of peripheral sensor (primary transducers), a sensor of full revolution of the turbo-machine working wheel and a sensor placed near the blade root, pulse shapers for said sensor, a unit for converting time intervals into a code, a control unit, an output register and an electronic computer.

The drawbacks of the known process and the device for putting the same into practice are as follows: a long time for making measurements and a complicated structure of the device due to the use of a high number of sensors. Otherwise, it is impossible to determine the initial oscillation phase for each blade.

SUMMARY OF THE INVENTION

In the present invention, all the oscillation parameters for each blade are determined with the use of one on-line sensor, which enables to determine the oscillation parameters of each blade during variations of the turbo-machine rotation shaft speed (of the turbo-machine operation mode modification).

For achieving the mentioned technical result, in the method for determining the blade oscillation parameters in a turbo-machine rotating working wheel, when the blade end travels in front of a sensor, reading values of a single pulse signal formed by the sensor are obtained in a number that is not lower than that of unknown parameters of a harmonic or polyharmonic oscillation, and the origin of a single pulsed signal readings obtained for each blade is synchronized with the blade end position relative to the sensor according to a given level of the single pulsed signal. Then the values of the harmonic or polyharmonic oscillation parameters of the blade are calculated with the use of the obtained values of the single pulsed signal reading origins and of the value of the turbo-machine shaft (working wheel) revolution period.

The turbo-machine shaft revolution period can be measured with a gauge of a full rotation of the turbo-machine shaft or as a time interval between single pulsed signals detected by the gauge from the same blade, since the number of blades (single pulses for a full revolution) is known.

For achieving the mentioned technical results, the device for putting into practice the above disclosed process comprises:

a peripheral sensor adjusted in the turbo-machine body,
a gauge of full rotation of the turbo-machine shaft mounted onto the fixed part of the turbo-machine,
a pulse shaper of the gauge of full rotation of the shaft,
a pulse shaper of the peripheral sensor,
a unit for converting time intervals into a code,
an electronic computer,
an analog-to-digital converter,
a low-pass filter the input of which is connected to the output of the peripheral detector, its output being connected to the information input of the analog-to-digital converter and to the input of the pulse shaper of the peripheral detector, the output of the pulse shaper of the peripheral detector is connected to a synchronizing input of the analog-to-digital converter, the digital outputs of the analog-to-digital converter are connected to the first part of the input digits of the digital interface of an electronic computer, the second part of the input digits of the digital interface of the electronic computer being connected to the output digit positions of the time interval converter unit the synchronizing input of which is connected to the pulse shaper output of the gauge of full rotation of the shaft; the third and the fourth parts of the input digits of the digital interface of the electronic computer are connected, respectively, to the output of the pulse shaper of the peripheral detector and to that of the pulse shaper of the gauge of full rotation of the shaft, and the input of the pulse shaper of the gauge of shaft full revolution is connected to the output of the gauge of shaft full revolution. The electronic computer represents an output unit of the device and allows one to accept, to memorize and to process input data, to store and to output final information under the form needed by the user.

An exciter for the gauge of full revolution of the turbo-machine shaft can be used under the form of a revolution mark mounted onto the turbo-machine rotor.

DETAILED DESCRIPTION

Figure 1:
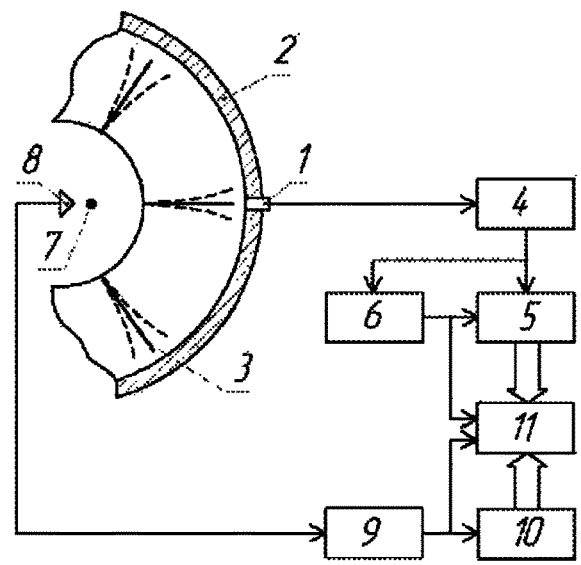
FIG. 1 is a structural diagram of the device putting into practice the process of the present invention.

The phase, frequency and amplitude of oscillations of the blades of a rotating turbo-machine wheel according to the present invention are determined as follows.

A peripheral sensor (a primary converter), for example, an eddy current sensor is mounted into the turbo-machine body in the close vicinity to the mechanical trajectory of the blade tip. Under working conditions or under a transient operating condition of the turbo-machine, single pulsed signals of the peripheral sensor that are generated at the passage of blade tips ends near-by are recorded.

To calculate the parameter values of a harmonic or polyharmonic oscillation of a blade on the basis of values of readings obtained for a single pulsed signal, the shape of a signal generated at the interaction of a particular kind of a primary converter with the tip end of a moving and simultaneously oscillating blade is modeled. For such a modeling, use is made of known analytical expressions describing signal shapes. For example, a pulse at the output of an eddy current sensor can be represented (described) by an analytical expression of a Gaussian pulse (see Nondestructive control and diagnostics: Reference book/V. V. Kluyev, F. R. Sosnin, A. V. Kovalev, et al.; edited by V. V. Kluyev, $2^{nd}$ edition, corrected and completed—Moscow; Mashinostroyenie, 2003, p. 401—in Russian), the independent variable of which comprises a functional dependence defining a law of the blade tip motion and the signal shape, in particular: front slope, duration and amplitude.

On the basis of a signal shape model and after solving a set of equations in which the values of obtained readings for a single pulsed signal, an algorithm and a program for determining the blade oscillation parameters are worked out. The explanation for the above mentioned is given below.

For each single pulsed signal, several amplitude-time readings are selected (according to the number of unknown parameters of polyharmonic oscillations of the blade: amplitude, frequency and initial phase of each harmonic oscillation); the readings obtained are substituted in the analytical expression defining the shape of the single pulsed signal; a set of nonlinear equations is formulated (at least 3 equations when the blade is under monoharmonic oscillation); the set of nonlinear equations is solved with the use of, for example, nonlinear approximation methods, and the blade oscillation parameters are determined.

Assume that, for example, a peripheral eddy current sensor generates, at the passage near-by of a blade tip, a bell-shape pulse that can be described with the expression for a Gaussian pulse (see "Nondestructive control and diagnostics: Reference book"/V. V. Kluyev, F. R. Sosnin, A. V. Kovalev, et al.; edited by V. V. Kluyev, $2^{nd}$ edition, corrected and completed.—Moscow; Mashinostroyenie, 2003, 656 p—in Russian)

$$s(y) = \exp\left(-\frac{y^2}{2a_y^2}\right),$$

where y is the travel of the blade tip, $a_y$ is a parameter of the Gaussian pulse.

Suppose that a blade of a rotating blade wheel oscillates according to the sinusoidal law with the amplitude A. Then the travel of the blade end will have two components: a rotary component and an oscillatory one, and will be defined by the expression:

$$y(t) = R\omega_K t + A \sin(\omega_\pi t + \phi),$$

where R is the wheel radius, $\omega_K$ is the angular frequency of the wheel rotation, $\omega_\pi$ and $\phi$ represents the angular frequency and the initial phase of the blade oscillations, respectively.

In this case, the output signal of the peripheral eddy current sensor, in the presence of oscillations, will be defined as:

$$s(t) = \exp\left(-\frac{1}{2a_t^2} \times \left(t + \frac{A}{R\omega_k}\sin(\omega_\pi t + f)\right)^2\right).$$

And, in the absence of oscillations, respectively:

$$s(t) = \exp\left(-\frac{1}{2a_t^2} \cdot t^2\right),$$

where $$a_t = \frac{a_y}{R\omega_K}$$

is a parameter of the Gaussian pulse having the time dimensionality.

Figure 2:
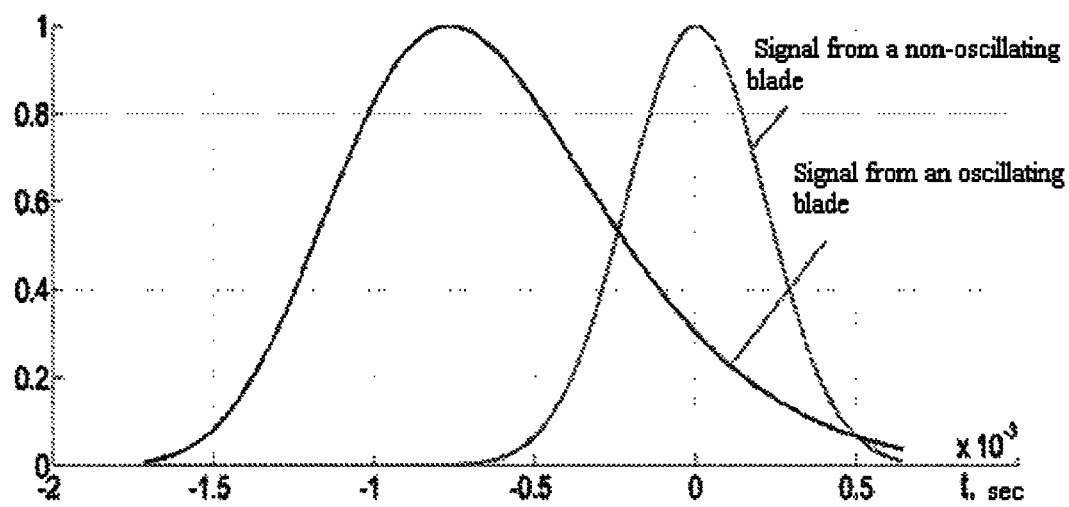
FIG. 2 illustrates the shape of output signals of the peripheral sensor (a primary converter).

The shape of output signals from the peripheral eddy current detector for both cases is illustrated in FIG. 2.

To determine unknown parameters of the blade oscillation, such as: amplitude A, frequency $\omega_\pi$ and initial phase $\phi$, it is necessary to solve, while analyzing the peripheral eddy current sensor output signal, a set of at least 3 nonlinear following equations:

$$\begin{cases} s(t_1) - \exp\left(-\frac{1}{2a_t^2} \cdot \left(t_1 + \frac{A}{R\omega_k}\sin(\omega_\pi t_1 + \varphi)\right)^2\right) = 0 \\ s(t_2) - \exp\left(-\frac{1}{2a_t^2} \cdot \left(t_2 + \frac{A}{R\omega_k}\sin(\omega_\pi t_2 + \varphi)\right)^2\right) = 0, \\ s(t_3) - \exp\left(-\frac{1}{2a_t^2} \cdot \left(t_3 + \frac{A}{R\omega_k}\sin(\omega_\pi t_3 + \varphi)\right)^2\right) = 0 \end{cases}$$

where origins of readings of a peripheral eddy current sensor signal from an oscillating blade at the times t1, t2 and t3 are assigned as initial data for approximation. To determine unknown parameters of the blade oscillation, use is made, for example, of nonlinear approximation methods.

The device for determining the blade oscillation parameters of the turbo-machine rotating wheel (FIG. 1) comprises a contactless peripheral sensor 1, for example, an eddy current one, mounted in the turbo-machine body 2 in the plane of the wheel rotation facing the mechanical trajectory of the blade tips 3, a low-pass filter 4 the input of which is connected to the output of the peripheral sensor 1, an analog-to-digital converter 5 the information input of which is connected to the output of the low-pass filter 4, a rectangular pulse shaper 6 of the peripheral detector 1 the input of which is connected as well to the output of the low-pass filter 4; the output of the shaper 6 is connected to the synchronizing input of the analog-to-digital converter 5; an exciter 7 (a mark, for example, made as a metallic pin on the disc of the blade wheel or on the turbo-machine rotor) of a gauge of full shaft revolution mounted on the turbo-machine rotor; a contactless gauge 8 of full shaft revolution, for example an eddy current one, mounted on the fixed part of the turbo-machine and facing the mark 7 motion trajectory; a pulse shaper 9 of the gauge of full shaft revolution the input of which is connected to the output of the gauge 8 of full shaft revolution; a unit 10 for converting time intervals into a code the synchronizing input of which is connected to the output of the shaper 9; an electronic computer 11, for example an IBM-type PC, the first part of the input digits of the digital interface of which is connected to the digital outputs of the analog-to-digital converter 5, the second part of the input digits of the digital interface of the electronic computer 11 being connected to the output digit positions of the time interval converter unit 10, the third and the fourth parts of the input digits of the digital interface of the electronic computer 11 are connected, respectively, to the outputs of the pulse shapers 6 and 9; the electronic computer being an output unit of the device, enabling to accept, to store and to process input data, while implementing the algorithm of nonlinear approximation for solving a set of nonlinear equations to determine unknown oscillation parameters, and to store and to output final information under the form needed by the user.

The device (FIG. 1) putting into practice the process for determining the blade oscillation parameters of the turbo-machine rotating wheel operates as follows. The contactless peripheral sensor 1, for example an eddy current one, mounted in the body 2 of the turbo-machine in the plane of the wheel rotation plane opposite to the motion trajectory of the blade tips 3, generates electric bell-shape pulses as a result of interaction with the blade tips ends, with the amplitude $U_{blade\ max}$, that are further supplied to the input of the low-pass filter 4 with the cut-off frequency of, for example, 100 kHz, providing suppression of high-frequency noise. Later on, the filtered signal is supplied to the information input of the analog-to-digital converter 5 and is supplied simultaneously to the rectangular pulse shaper 6 of the peripheral detector, for example, a comparator with the comparison level $0.1\ U_{blade\ max}$, to form pulses corresponding to particular blades. The rectangular pulses formed in amplitude and in duration by the shaper 6 are supplied to the synchronizing input of the analog-to-digital converter 5, the leading edge of which represents the start and the cut-off of which represents the end of numeralization of continuous (analog) bell-shape pulses of the peripheral sensor 1. The exciter (mark) 7 of the gauge of full shaft revolution mounted, for example, on the turbo-machine rotor, while passing by the contactless gauge 8 of full shaft revolution, for example, an eddy current one, interacts therewith, the gauge 8 of full shaft revolution generates a pulsed signal with the amplitude $U_{revol.\ max}$, which is supplied to the rectangular pulse shaper 9 of the gauge of full shaft revolution, for example, a comparator with the comparison level $0.1\ U_{revol.\ max}$. The rectangular pulse shaped in amplitude and in duration is then supplied to the input of the unit 10 converting a time interval (a revolution period of the turbo-machine rotor) into a code that is later supplied from the output of the unit 10 to the second part of the input digits of the digital interface in the electronic computer 11, for example, an IBM-type PC. Besides, the rectangular pulses designed to synchronize and to control the recording and calculation of information parameters are supplied from the outputs of the shapers 6 and 9 respectively to the third and fourth parts of the input digits of the digital interface in the electronic computer 11. The electronic computer 11 represents an output unit of the device that implements the possibility to obtain and to memorize code readings of the analog-to-digital converter 5 for each blade as well as the code readings of the unit 10 converting a time interval (a revolution period of the turbo-machine rotor) to store and to make necessary calculations in order to run the nonlinear approximation algorithm while solving a set of nonlinear equations to determine unknown parameters of blade oscillations and to deliver information to the user in a needed form.

The invention claimed is:

1. A method for determining the oscillation parameters of turbo-machine blades, comprising:
   when the blade tip travels in front of a sensor, reading values of a single pulsed signal formed by the sensor are obtained in a number that is not lower than that of unknown parameters of a harmonic or polyharmonic oscillation of the blade, and
   the origin of a single pulsed signal readings obtained for each blade is synchronized with the blade tip position relative to the sensor according to a given level of the single pulsed signal;
   then the values of the harmonic or polyharmonic oscillation parameters of the blade are calculated with the use of the obtained values of the single pulsed signal reading origins and of the value of the turbo-machine shaft revolution period.

2. A device for putting into practice the process of claim 1, comprising
   a peripheral sensor,
   a gauge of shaft full revolution,
   a pulse shaper of the gauge of shaft full revolution,
   a pulse shaper of the peripheral sensor,
   a unit for converting time intervals into a code and an electronic computer,
   an analog-to-digital converter, and
   a low-pass filter the input of which is connected to the output of the peripheral sensor, its output being connected to the information input of the analog-to-digital converter and to the input of the pulse shaper of the peripheral sensor,
   wherein the output of the pulse shaper of the peripheral sensor is connected to a synchronizing input of the analog-to-digital converter,
   wherein the digital outputs of the analog-to-digital converter are connected to the first part of the input digits of the digital interface of an electronic computer, the second part of the input digits of the digital interface of the electronic computer being connected to the output digit positions of the time interval converter unit the synchronizing input of which is connected to the pulse shaper output of the gauge of shaft full revolution;
   wherein the third and the fourth parts of the input digits of the digital interface of the electronic computer are connected, respectively, to the output of the pulse shaper of the peripheral detector and to that of the pulse shaper of the gauge of shaft full revolution, and
   wherein the input of the pulse shaper of the gauge of shaft full revolution is connected to the output of the gauge of shaft full revolution.

3. The method of claim 1, wherein the turbo-machine shaft revolution period is determined as a time interval between single pulsed signals of the same blade.

4. The method of claim 1, wherein the turbo-machine shaft revolution period is measured with a gauge of full revolution of the turbo-machine shaft.

\* \* \* \* \*